(12) United States Patent
Zhong et al.

(10) Patent No.: US 10,062,746 B2
(45) Date of Patent: Aug. 28, 2018

(54) SEMICONDUCTOR RECTIFIER AND MANUFACTURING METHOD THEREOF

(71) Applicant: CSMC TECHNOLOGIES FAB1 CO., LTD., Wuxi New District, Jiangsu (CN)

(72) Inventors: Shengrong Zhong, Jiangsu (CN); Xiaoshe Deng, Jiangsu (CN); Dongfei Zhou, Jiangsu (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/539,554

(22) PCT Filed: Sep. 10, 2015

(86) PCT No.: PCT/CN2015/089319
§ 371 (c)(1),
(2) Date: Jun. 23, 2017

(87) PCT Pub. No.: WO2016/101655
PCT Pub. Date: Jun. 30, 2016

(65) Prior Publication Data
US 2017/0352722 A1 Dec. 7, 2017

(30) Foreign Application Priority Data
Dec. 25, 2014 (CN) .......................... 2014 1 0828687

(51) Int. Cl.
*H01L 29/06* (2006.01)
*H01L 21/78* (2006.01)
(Continued)

(52) U.S. Cl.
CPC ........ *H01L 29/06* (2013.01); *H01L 21/02293* (2013.01); *H01L 21/041* (2013.01);
(Continued)

(58) Field of Classification Search
None
See application file for complete search history.

(56) References Cited

U.S. PATENT DOCUMENTS 9,722,035 B2 * 8/2017 Yeh .................... H01L 21/30604
2005/0029614 A1 * 2/2005 Wu .................... H01L 29/66143
257/471
(Continued)

FOREIGN PATENT DOCUMENTS

CN 101859703 10/2010
CN 203013738 6/2013
(Continued)

OTHER PUBLICATIONS

International search report for international application No. PCT/CN2015/089319, dated Dec. 3, 2015, 4 pages (including English translation).

*Primary Examiner* — Joseph Schoenholtz
(74) *Attorney, Agent, or Firm* — Hamre, Schumann, Mueller & Larson, P.C.

(57) ABSTRACT

A semiconductor rectifying device includes a substrate of a first conductivity type, an epitaxial layer of the first conductivity type, a filling structure, an upper electrode, a guard ring, and a guard layer. The epitaxial layer defines a plurality of trenches thereon. The filling structure includes an insulating material formed on the inner surface of the trench and a conductive material filled in the trench. A doped region of a second conductivity type is formed in the surface of the epitaxial layer between the filling structures. A method of manufacturing a semiconductor rectifying device includes forming an epitaxial layer of a first conductivity type on a substrate of the first conductivity type, defining a plurality of trenches on the epitaxial layer, forming a plurality of filling
(Continued)

structures in the plurality of trenches, and forming a doped region in the epitaxial layer between the filling structures.

12 Claims, 8 Drawing Sheets

(51) Int. Cl.
*H01L 21/02* (2006.01)
*H01L 21/04* (2006.01)
*H01L 29/861* (2006.01)
*H02M 3/158* (2006.01)
*H01L 21/768* (2006.01)

(52) U.S. Cl.
CPC ........ *H01L 21/76877* (2013.01); *H01L 21/78* (2013.01); *H01L 29/861* (2013.01); *H02M 3/1588* (2013.01); *H01L 21/02378* (2013.01)

(56) References Cited

U.S. PATENT DOCUMENTS

| | | | |
|---|---|---|---|
| 2012/0018836 A1* | 1/2012 | Nagai | H01L 29/0619 257/471 |
| 2013/0075784 A1 | 3/2013 | Ikeda | |
| 2016/0099306 A1* | 4/2016 | Cheng | H01L 29/402 257/476 |
| 2016/0260703 A1* | 9/2016 | Nakamura | H01L 29/404 |

FOREIGN PATENT DOCUMENTS

| | | |
|---|---|---|
| CN | 103904106 | 7/2014 |
| CN | 104103694 A | 10/2014 |

\* cited by examiner

SEMICONDUCTOR RECTIFIER AND MANUFACTURING METHOD THEREOF

FIELD OF THE INVENTION

The present disclosure relates to the field of semiconductor device, and particularly relates to a semiconductor rectifying device and a manufacturing method thereof.

BACKGROUND OF THE INVENTION

Semiconductor diodes have such characteristics that when voltage is forward biased, they allow electric currents to pass through, and when the voltage is reverse biased, they do not allow the currents to pass through. Semiconductor diodes are widely used in various types of electronic circuits such as power supply circuits, signal processing circuits and so on. For a particular type of diode, a forward current is substantially negligible until a forward voltage drop reaches a certain value. For example, silicon p-n junction diodes have a forward voltage drop of at least around 0.7 V. The forward voltage drop of many silicon Schottky barrier diodes can be 0.4 V or even lower owing to Schottky barrier characteristics. The forward voltage drop of germanium p-n junction diodes is about 0.3 V, but their manufacturing process is not compatible with silicon process, and they are very sensitive to temperature, so they are not widely applied. In order to improve the rectification efficiency of a circuit, it is of great significant to reduce the forward voltage drop of a diode as far as possible.

In practical applications, the diode works not only in a current-conducting state, but also in a current-blocking state. Reverse leakage may appears on a current-blocking diode. The leakage will increase circuit loss, reduce circuit conversion efficiency, especially in high temperature applications. Therefore, it is desired that the diode has not only a low forward voltage drop, but also a low reverse leakage.

In many applications, there are inductors in the electronic circuits. Reverse voltage generated by the inductors may be applied to a diode, leading to an avalanche breakdown of the diode. Usually avalanche ruggedness is used to characterize the maximum energy that the device can absorb from the inductor without failing, which is a parameter depending on the size of a junction area for energy dissipation of the device.

SUMMARY

Accordingly, it is necessary to provide a semiconductor rectifying device having low forward voltage drop, low reverse leakage, high reverse breakdown voltage, and high avalanche ruggedness.

A semiconductor rectifying device includes: a substrate of a first conductivity type; an epitaxial layer of the first conductivity type formed on the substrate of the first conductivity type, wherein the epitaxial layer of the first conductivity type defines a plurality of trenches thereon; a plurality of filling structures, each filling structure comprising an insulating layer formed on an inner surface of the trench and a conductive material filled in the trench; a doped region of a second conductivity type formed in a surface layer of the epitaxial layer of the first conductivity type located between the filling structures, wherein the doped region of the second conductivity type and the filling structure form a conductive channel therebetween; an upper electrode formed on a surface of the epitaxial layer of the first conductivity type, wherein the upper electrode is in contact with both the conductive materials of the plurality of filling structures and the doped region of the second conductivity type; a guard ring formed by doping of a dopant of the second conductivity type, being located in the surface layer of the epitaxial layer of the first conductivity type; wherein the guard ring surrounds a cell region composed of the plurality of filling structures and the doped region of the second conductivity type; and an annular guard layer formed on the surface of the epitaxial layer of the first conductivity type other than the cell region, wherein the guard layer covers the guard ring.

A method of manufacturing a semiconductor rectifying device includes the steps of: providing a substrate of a first conductivity type, and forming an epitaxial layer of the first conductivity type on a front side of the substrate of the first conductivity type; defining a plurality of trenches on the epitaxial layer of the first conductivity type, and forming a plurality of filling structures in the plurality of trenches; wherein the filling structure comprises an insulating layer formed on an inner surface of the trench and a conductive material filled in the trench; forming a doped region of a second conductivity type in a surface layer of the epitaxial layer of the first conductivity type located between the filling structures, and forming an annular guard ring surrounding a cell region composed of the plurality of filling structures and the doped region of the second conductivity type, wherein the doped region of the second conductivity type and the filling structure form a conductive channel therebetween; forming an annular guard layer on a surface of the epitaxial layer of the first conductivity type other than the cell region, wherein the guard layer covers the guard ring; and forming an upper electrode on the surface of the epitaxial layer of the first conductivity type, wherein the upper electrode is in contact with both the conductive materials of the plurality of filling structures and the doped region of the second conductivity type.

When the aforementioned semiconductor rectifying device is forward biased, the electronic current flows from an upper electrode (anode) through the conductive channel near the surface of the filling structure to the substrate of the first conductivity type, and there is almost no potential barrier for electron movement, and owing to the electron enhancement effect on the surface of the filling structure, the forward voltage drop of the device significantly becomes lower. When reverse biased, using the lateral carrier depletion of a p-n junction (between the doped region of the second conductivity type and the filling structure), the aforementioned semiconductor rectifying device forms a space charge region which blocks the movement of carriers, so that the reverse leakage of the device becomes low, and the reverse voltage increases. The presence of each filling structure increases the size of a junction area for energy dissipation of the device, thus allowing the device to have high reverse breakdown voltage and high avalanche ruggedness.

The method of manufacturing the semiconductor rectifying device is compatible with a trench MOS process. The whole process of the method adopts four photomasks so as to simplify the process and reduce the manufacturing cost.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following description. Apparently, the accompanying drawings in the following description are only some embodiments of the present disclosure, and persons of ordinary skill in the art can derive other drawings from the accompanying drawings without making creative efforts.

DETAILED DESCRIPTION OF THE EMBODIMENTS

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

Specific embodiments of the present disclosure will be described in detail hereinafter with reference to the accompanying drawings.

Figure 1:
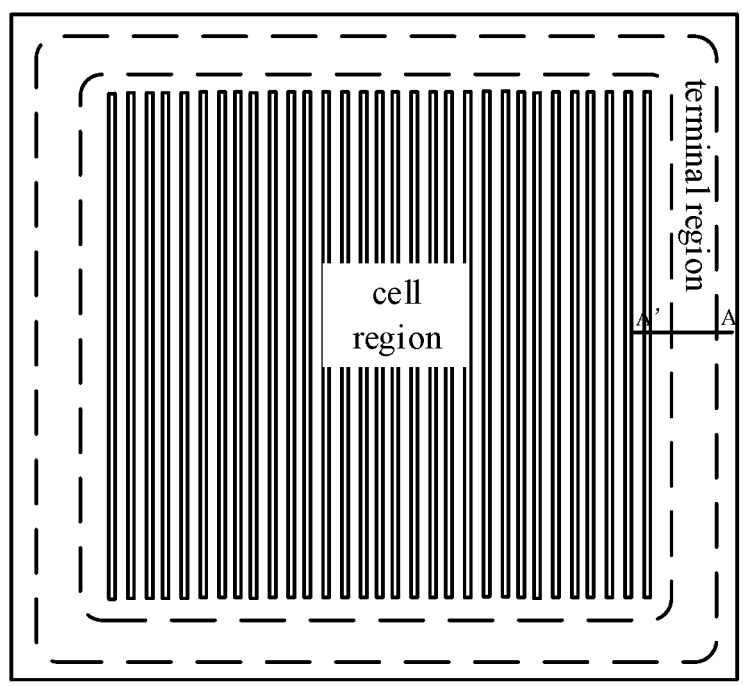
FIG. 1 is a schematic diagram of a semiconductor rectifying device according to an embodiment.
Figure 2:
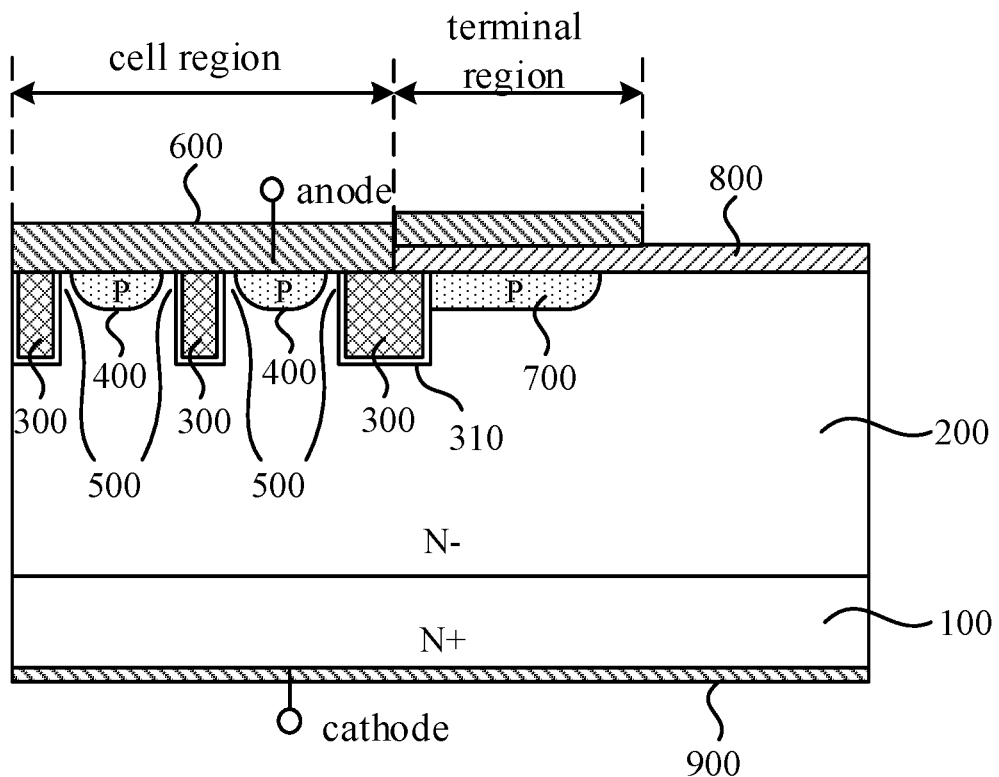
FIG. 2 is a cross-sectional view taken along line A-A' in FIG. 1.

FIG. 1 is a schematic diagram of a semiconductor rectifying device according to an embodiment, and FIG. 2 is a cross-sectional view taken along line A'-A in FIG. 1.

A semiconductor rectifying device includes a substrate 100 of a first conductivity type, an epitaxial layer 200 of the first conductivity type, a plurality of filling structures 300, a doped region 400 of a second conductivity type, an upper electrode 600, a guard ring 700, a guard layer 800, and a lower electrode 900.

The epitaxial layer 200 of the first conductivity type is formed on a front side of the substrate 100 of the first conductivity type, and thickness and resistivity of the epitaxial layer 200 of the first conductivity type are determined according to the device withstand voltage demand. A plurality of trenches 310 are defined on the epitaxial layer 200 of the first conductivity type.

Figure 3:
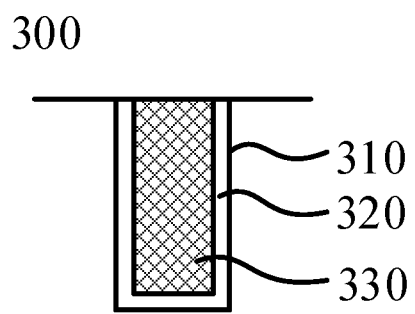
FIG. 3 is a schematic diagram of a trench and a filling structure.

Referring to FIG. 3, the filling structure 300 includes an insulating layer 320 formed on the inner surface of the trench 310 and a conductive material 330 filled in the trench 310.

The doped region 400 of the second conductivity type is formed in a surface layer of the epitaxial layer 200 of the first conductivity type located between the filling structures 300, and a conductive channel 500 is formed between the doped region 400 of the second conductivity type and the filling structure 300. In other words, in the epitaxial layer 200 of the first conductivity type, a gap is formed between the doped region 400 of the second conductivity type and the filling structure 300.

The upper electrode 600 is formed on the surface of the epitaxial layer 200 of the first conductivity type, and the upper electrode 600 is in contact with both the conductive material 330 of the plurality of filling structures 300 and the doped region 400 of the second conductivity type.

The annular guard ring 700 is formed by doping of a dopant of the second conductivity type, and the guard ring 700 is located in the surface layer of the epitaxial layer 200 of the first conductivity type. The guard ring 700 surrounds a cell region composed of the plurality of filling structures 300 and the doped region 400 of the second conductivity type. The guard ring 700 is a voltage dividing ring for reducing the surface electric field strength and improving the breakdown voltage.

The annular guard layer 800 is formed on the surface of the epitaxial layer 200 of the first conductivity type other than the cell region, and the guard layer 800 covers the guard ring 700. The upper electrode 600 also extends over the surface of the guard layer 800 on the epitaxial layer 200 of the first conductivity type located outside the cell region to form a terminal region.

The lower electrode 900 is formed on a backside of the substrate 100 of the first conductivity type.

In the present embodiment, the substrate 100 of the first conductivity type is an N$^+$-type substrate (crystal orientation is <100>), the epitaxial layer 200 of the first conductivity type is an N$^-$-type epitaxial layer, and the doped region 400 of the second conductivity type is a P$^+$-type doped region. The substrate 100 of the first conductivity type and the epitaxial layer 200 of the first conductivity type are made of silicon, silicon carbide, gallium arsenide, indium phosphide, or germanium silicon; the insulating layer 320 is made of silicon dioxide, and the conductive material 330 is polysilicon. The upper electrode 600 and the lower electrode 900 are metals having good conductivity, such as copper, aluminum, or gold.

The cell structure of the cell region is not limited to stripe cells parallel to each other, but can also be one of meshed cells, square cells arranged in a square array, hexagonal cells arranged in a hexagonal array, and so on.

Figure 4:
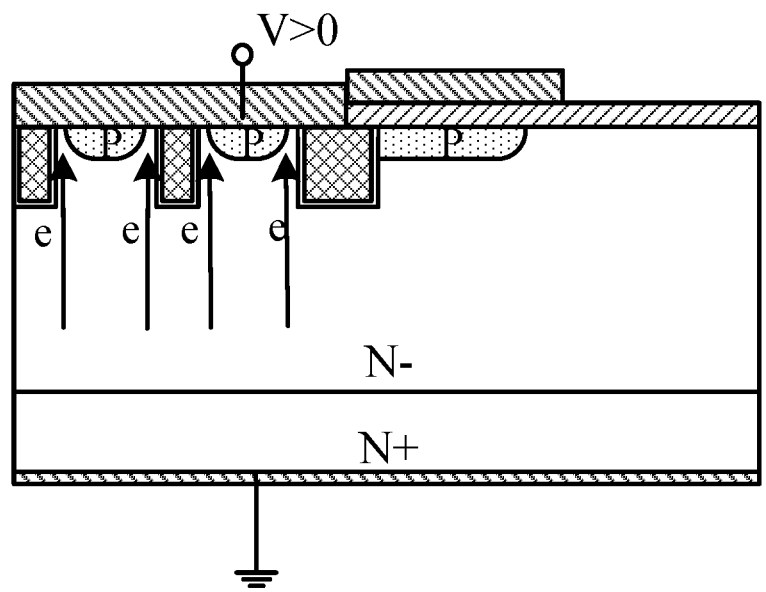
FIG. 4 is a schematic diagram of a semiconductor rectifying device which is forward biased.
Figure 5:
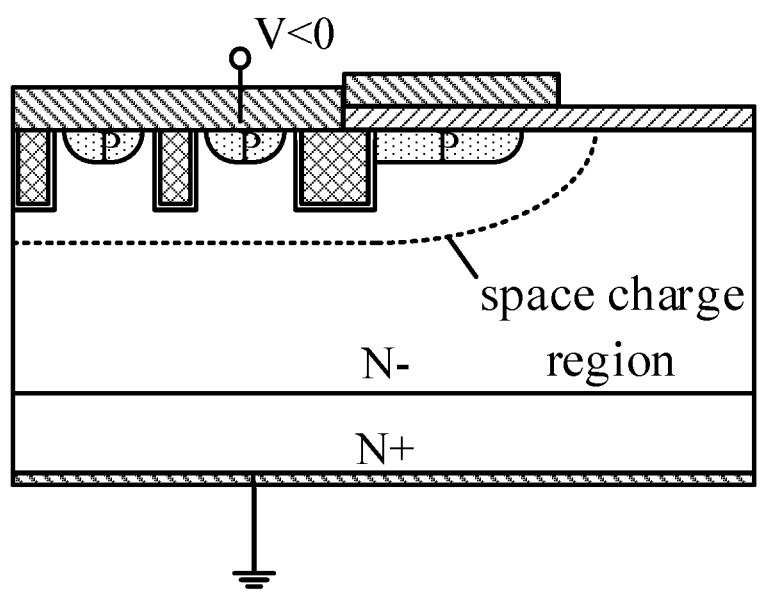
FIG. 5 is a schematic diagram of a semiconductor rectifying device which is reverse biased.

Referring to FIG. 4, when the aforementioned semiconductor rectifying device is forward biased, the electronic current flows from the upper electrode (anode) through the conductive channel near the surface of the filling structure to the lower electrode (i.e., cathode) of the substrate of the first conductivity type, and there is almost no potential barrier for electron movement, and owing to the electron enhancement effect on the surface of the filling structure, the forward voltage drop of the device significantly becomes lower. Referring to FIG. 5, when reverse biased, using the lateral carrier depletion of a p-n junction (between the doped region of the second conductivity type and the filling structure), the aforementioned semiconductor rectifying device forms a space charge region which blocks the movement of carriers, so that the reverse leakage of the device becomes low, and the reverse voltage increases. The presence of each filling structure increases the size of a junction area for energy dissipation of the device, thus allowing the device to have high reverse breakdown voltage and high avalanche ruggedness.

A method of manufacturing the aforementioned semiconductor rectifying device is also disclosed.

In the following description, the substrate 100 of the first conductivity type is an N+-type substrate (crystal orientation is <100>), the epitaxial layer 200 of the first conductivity type is an N−-type epitaxial layer, and the doped region 400 of the second conductivity type is a P+-type doped region. The substrate 100 of the first conductivity type and the epitaxial layer 200 of the first conductivity type are made of silicon, silicon carbide, gallium arsenide, indium phosphide, or germanium silicon; the insulating layer 320 is made of silicon dioxide, and the conductive material 330 is polysilicon. The upper electrode 600 and the lower electrode 900 are metals having good conductivity, such as copper, aluminum, or gold.

Figure 6:
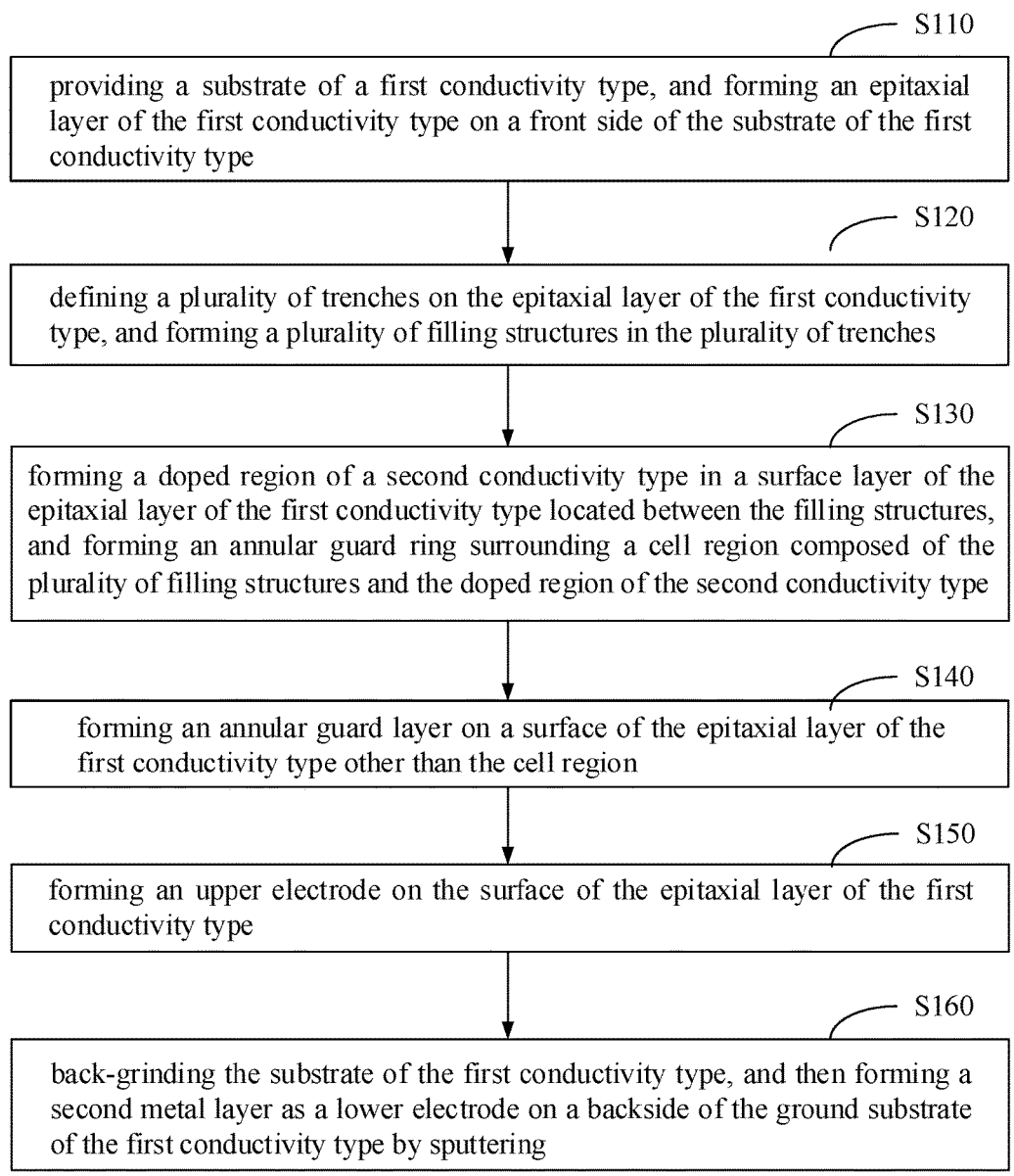
FIG. 6 is a flow chart of a method of manufacturing a semiconductor rectifying device according to an embodiment.

Referring to FIG. 6, a method of manufacturing a semiconductor rectifying device includes the steps of:

In step S110: provide a substrate 100 of a first conductivity type, and then epitaxially grow and form an epitaxial layer 200 of the first conductivity type on the front side of the substrate 100 of the first conductivity type. The thickness and resistivity of the epitaxial layer 200 of the first conductivity type are determined according to the device withstand voltage demand.

In step S120: clean a front side of the epitaxial layer 200 of the first conductivity type, then define a plurality of trenches 310 on the epitaxial layer 200 of the first conductivity type, and form a plurality of filling structures 300 in the plurality of trenches 310. The filling structure 300 includes an insulating layer 320 formed on the surface within the trench 310 and a conductive material 330 filled in the trench 310.

Figure 7:
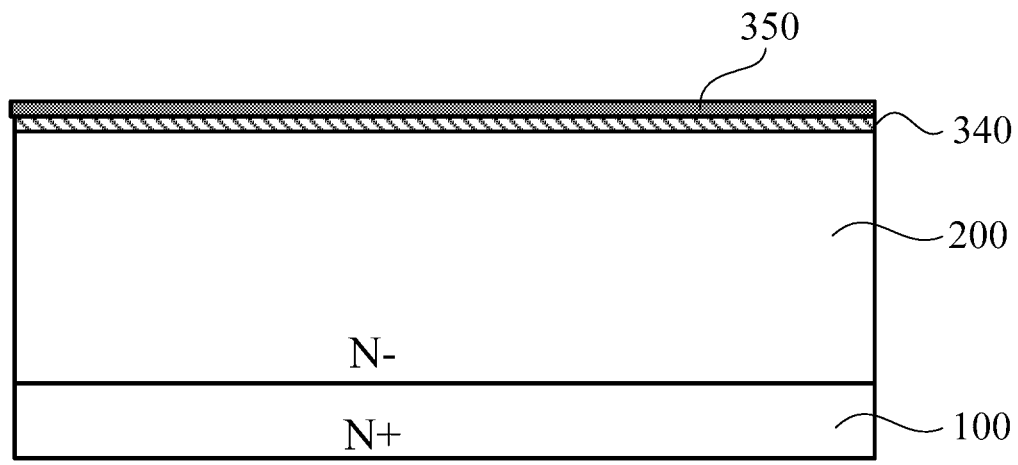
FIG. 7 is a schematic diagram of a device after an oxide layer and a silicon nitride layer are formed.

In the present embodiment, the step of forming a plurality of trenches 310 on the epitaxial layer 200 of the first conductivity type, and forming a plurality of filling structures 300 in the plurality of trenches 310 includes:

In step S121: an oxide layer 340 having a thickness of from 30 nm to 200 nm is epitaxially grown and formed on the epitaxial layer 200 of the first conductivity type, and then a silicon nitride layer 350 having a thickness of from 40 nm to 200 nm is deposited and formed on the oxide layer 340. Please refer to FIG. 7.

Figure 8:
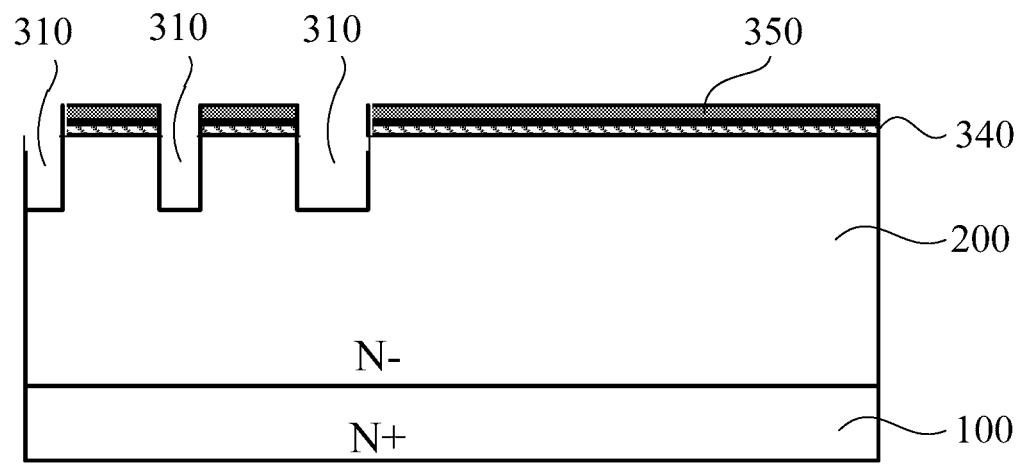
FIG. 8 is a schematic diagram of a device after a trench is formed.

In step S122: after patterning the silicon nitride layer 350 and the oxide layer 340, perform silicon etching to the epitaxial layer 200 of the first conductivity type using the silicon nitride layer 350 and the oxide layer 340 as mask to form the plurality of trenches 310. Perform coating, exposure, and development sequentially using a trench photomask, and etch the silicon nitride layer 350, etch the oxide layer 340 next, then remove a photoresist. Perform silicon etching with the silicon nitride layer 350 being used as a hard mask to form the trench. Please refer to FIG. 8.

Figure 9:
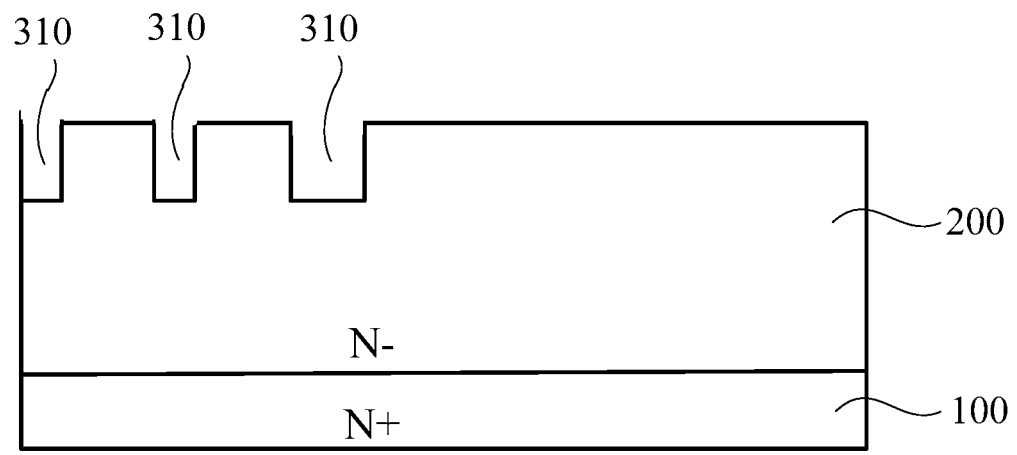
FIG. 9 is a schematic diagram of a device after an oxide layer and a silicon nitride layer are removed.

In step S123: remove the silicon nitride layer 350 and the oxide layer 340 as masks by etching. Please refer to FIG. 9.

Figure 10:
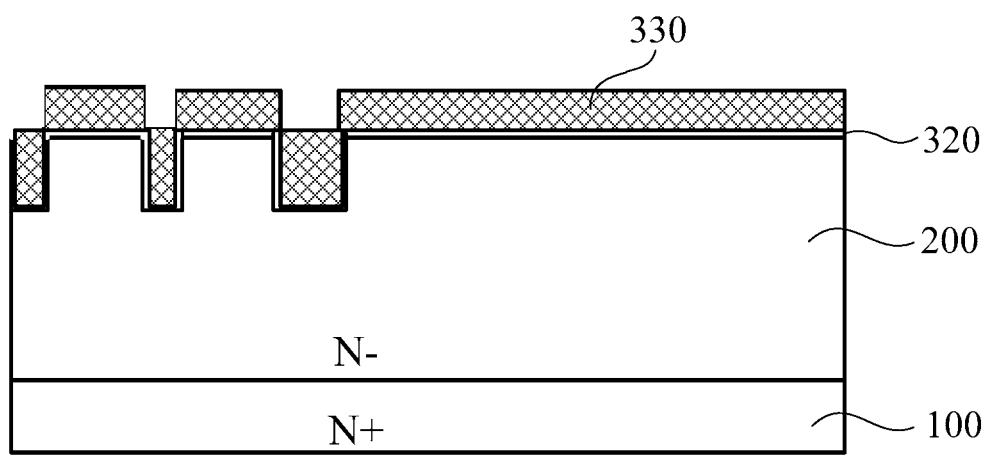
FIG. 10 is a schematic diagram of a device after a filling structure is formed.

In step S124: an insulating layer 320 (silicon dioxide) having a thickness of 5 nm to 120 nm is epitaxially grown and formed on the epitaxial layer 200 of the first conductivity type, and then form a conductive material 330 (polysilicon) having a thickness of from 60 nm to 500 nm on the insulating layer 320 to completely fill the trench. So far, the filling structure 300 is formed. Please refer to FIG. 10.

Proceed to the following steps after the filling structure 300 is formed.

In step S130: form a doped region 400 of a second conductivity type in the surface layer of the epitaxial layer 200 of the first conductivity type between the respective filling structures 300, and form an annular guard ring 700 surrounds a cell region composed of the plurality of filling structures 300 and the doped region 400 of the second conductivity type. A conductive channel 500 is formed between the doped region 400 of the second conductivity type and the filling structure 300. In other words, in the epitaxial layer 200 of the first conductivity type, a gap is formed between doped region 400 of the second conductivity type and the filling structure 300. The guard ring 700 is a voltage dividing ring for reducing the surface electric field strength and improving the breakdown voltage.

Figure 11:
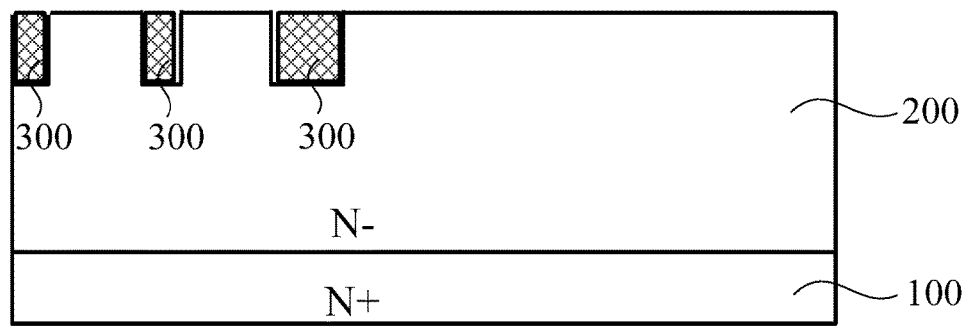
FIG. 11 is a schematic diagram of a device after a conductive material and an insulating layer located outside a trench are removed.

In the present embodiment, the step of forming the doped region 400 of the second conductivity type and forming the guard ring 700 includes:

In step S131a: remove the conductive material 330 and the insulating layer 320 located outside the trench 310 by etching. Please refer to FIG. 11.

Figure 12:
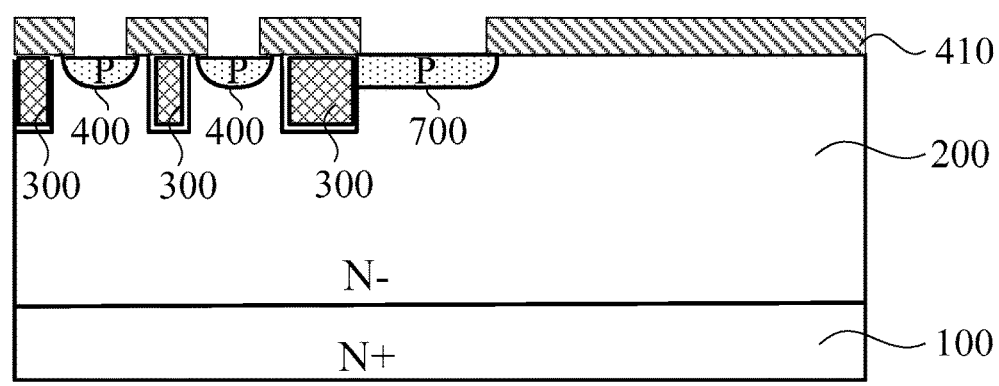
FIG. 12 is a schematic diagram of a device after a doped region of a second conductivity type and a guard ring are formed.

In step S132a: perform two implantations of a dopant of the second conductivity type (P-type dopant) to a region (on a surface of the epitaxial layer 200 of the first conductivity type) between the filling structures 300 of the surface layer of the epitaxial layer 200 of the first conductivity type, and an annular region (on the surface of the epitaxial layer 200 of the first conductivity type) surrounding the cell region, using a photoresist 410 (P body photomask) as a mask. The dopant of the second conductivity type is implanted for a first time with an energy of 60 to 120 keV and a dosage of $1e^{11}$ to $1e^{14}$ to form a P-well (P body). The dopant of the second conductivity type is implanted for a second time with an energy of 20 to 40 keV and a dosage of $1e^{14}$ to $1e^{15}$ to form a good Ohmic contact. The conductive channel 500 is formed between the doped region 400 of the second conductivity type and the filling structure 300. Please refer to FIG. 12.

In step S133a: remove the photoresist 410 and perform heat treatment to a region where the dopant of the second conductivity type is implanted so as to active the implanted dopant.

In other embodiments, the steps of forming the doped region 400 of the second conductivity type and forming the guard ring 700 may also be steps of exchanged steps of S131a and S132a. That is:

In step S131b: perform two implantations of a dopant of the second conductivity type (P-type dopant) to a region (on a surface of the conductive materials 330) between the filling structures 300 of the surface layer of the epitaxial layer 200 of the first conductivity type, and an annular region (on the surface of the conductive materials 330) surrounding the cell region, using a photoresist 410 as a mask. The dopant of the second conductivity type is implanted for a first time with an energy of 60 to 120 keV and a dosage of $1e^{11}$ to $1e^{14}$ to form a P-well (P body). The dopant of the second conductivity type is implanted for a second time with an energy of 20 to 40 keV and a dosage of $1e^{14}$ to $1e^{15}$ to form a good Ohmic contact. The conductive channel 500 is formed between the doped region 400 of the second conductivity type and the filling structure 300. Please refer to FIG. 12.

In step S132b: remove the conductive material 330 and the insulating layer 320 located outside the trench 310 by etching.

In step S133: remove the photoresist 410 and perform heat treatment to a region where the dopant of the second conductivity type is implanted so as to active the implanted dopant.

So far, the doped region 400 of the second conductivity type and the guard ring 700 are formed. After the doped region 400 of the second conductivity type and the guard ring 700 are formed, perform a deposition of tetraethyl orthosilicate (TEOS).

Figure 13:
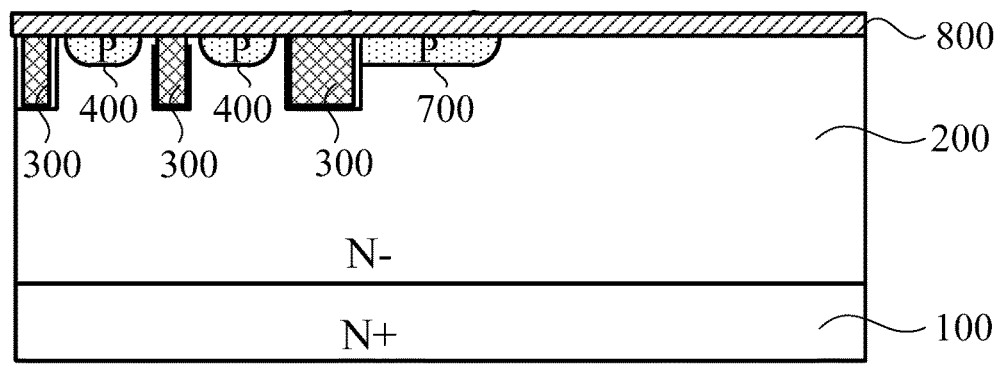
FIG. 13 is a schematic diagram of a device after a guard layer is formed.
Figure 14:
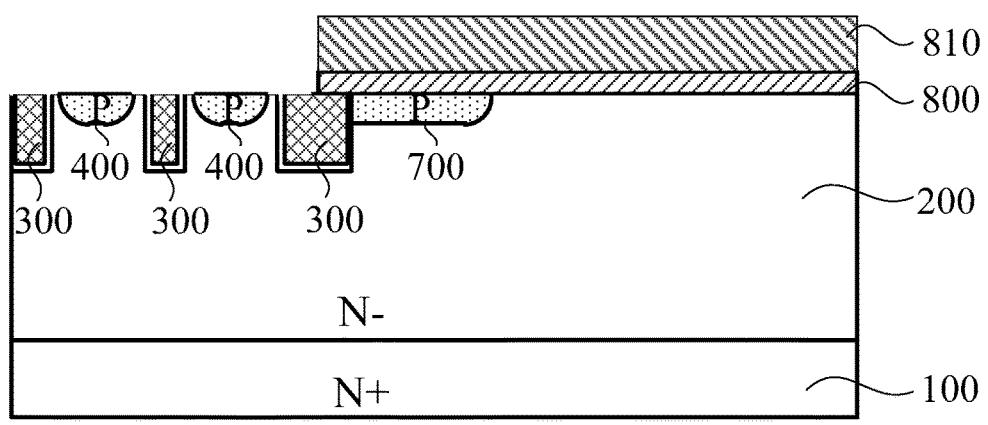
FIG. 14 is a schematic diagram of a device after a guard layer is etched.

In step S140: forming an annular guard layer 800 on the surface of the epitaxial layer 200 of the first conductivity type other than the cell region by deposition. The guard layer 800 covers the guard ring 700 as a terminal region guard layer. The guard layer 800 is made of TEOS. Please refer to FIGS. 13 and 14.

In the present embodiment, the step of forming the annular guard layer 800 includes:

Forming a layer of TEOS (the guard layer 800) having a thickness of from 300 nm to 1600 nm on the surface of the epitaxial layer 200 of the first conductivity type, and then removing partial layer of the TEOS by etching so as to form the guard layer 800 covering the guard ring 700. Using an active photomask 810, performing coating, exposure, and development sequentially, and then removing all the TEOS in the cell region and partial TEOS in the terminal region by etching. Forming the annular guard layer 800 which covers the guard ring 700.

Proceed to the following steps after the annular guard layer 800 is formed.

In step S150: form an upper electrode 600 (as an anode) on the surface of the epitaxial layer 200 of the first conductivity type. The upper electrode 600 is in contact with both the conductive materials 330 of the plurality of filling structures 300 and the doped region 400 of the second conductivity type. Form a first metal layer on the surface of the epitaxial layer 200 of the first conductivity type by sputtering, then form the upper electrode 600 in contact with both the conductive materials 330 of the plurality of the filling structures 300 and the doped region 400 of the second conductivity type by etching the first metal layer using a metal photomask, and form a front metal lead wire.

In step S160: back-grind the substrate 100 of the first conductivity type, and then form a second metal layer as a lower electrode 900 (as a cathode) on a backside of the ground substrate 100 of the first conductivity type by sputtering, and form a back metal lead wire.

So far, the structure of the device as shown in FIG. 2 is accomplished.

Referring to FIG. 4, when the aforementioned semiconductor rectifying device is forward biased, the electronic current flows from the upper electrode (anode) through the conductive channel near the surface of the filling structure to the lower electrode (cathode) of the substrate of the first conductivity type, and there is almost no potential barrier for electron movement, and owing to the electron enhancement effect on the surface of the filling structure, the forward voltage drop of the device significantly becomes lower.

Referring to FIG. 5, when reverse biased, using the lateral carrier depletion of a p-n junction (between the doped region of the second conductivity type and the filling structure), the aforementioned semiconductor rectifying device forms a space charge region which blocks the movement of carriers, so that the reverse leakage of the device becomes low, and the reverse voltage increases. The presence of each filling structure increases the size of the junction area for energy dissipation of the device, thus allowing the device to have high reverse breakdown voltage and high avalanche ruggedness.

The method of manufacturing the semiconductor rectifying device is compatible with a trench MOS process. The whole process of the method adopts four photomasks (trench photomask, P body photomask, active photomask, and metal photomask) so as to simplify the process and reduce the manufacturing cost.

Although the disclosure is illustrated and described herein with reference to specific embodiments, the disclosure is not intended to be limited to the details shown. Rather, various modifications may be made in the details within the scope and range of equivalents of the claims and without departing from the disclosure. Therefore, the scope of the present disclosure shall be defined by the appended claims.

What is claimed is:

1. A semiconductor rectifying device, comprising:
    a substrate of a first conductivity type;
    an epitaxial layer of the first conductivity type formed on the substrate of the first conductivity type, wherein the epitaxial layer of the first conductivity type defines a plurality of trenches thereon;
    a plurality of filling structures, each of the filling structures comprising an insulating layer formed on an inner surface of the trench and a conductive material filled in the trench;
    a doped region of a second conductivity type formed in a surface layer of the epitaxial layer of the first conductivity type located between the filling structures, wherein the doped region of the second conductivity type and the filling structure form a conductive channel therebetween, the conductive channel formed to extend from a surface of the epitaxial layer;
    an upper electrode formed on the surface of the epitaxial layer of the first conductivity type, wherein the upper electrode is in contact with both the conductive materials of the plurality of filling structures, the doped region of the second conductivity type, and the conductive channel;
    a guard ring formed by doping of a dopant of the second conductivity type, being located in the surface layer of the epitaxial layer of the first conductivity type, wherein the guard ring surrounds a cell region composed of the plurality of filling structures and the doped region of the second conductivity type; and
    an annular guard layer formed on the surface of the epitaxial layer of the first conductivity type other than the cell region, wherein the guard layer covers the guard ring.

2. The semiconductor rectifying device of claim 1, wherein the substrate of the first conductivity type is an $N^+$-type substrate, the epitaxial layer of the first conductivity type is an $N^-$-type epitaxial layer, and the doped region of the second conductivity type is a $P^+$-type doped region.

3. The semiconductor rectifying device of claim 1, wherein the substrate of the first conductivity type and the epitaxial layer of the first conductivity type are made of silicon, silicon carbide, gallium arsenide, indium phosphide, or germanium silicon; the insulating layer is made of silicon dioxide, and the conductive material is polysilicon.

4. The semiconductor rectifying device of claim 1, wherein the upper electrode is made of copper, aluminum, or gold.

5. The semiconductor rectifying device of claim 1, wherein the cell region comprises at least one selected from the group consisting of: stripe cells parallel to each other, meshed cells, square cells arranged in a square array, and hexagonal cells arranged in a hexagonal array.

6. A method of manufacturing a semiconductor rectifying device, comprising:
providing a substrate of a first conductivity type, and forming an epitaxial layer of the first conductivity type on a front side of the substrate of the first conductivity type;
defining a plurality of trenches on the epitaxial layer of the first conductivity type, and forming a plurality of filling structures in the plurality of trenches wherein, each of the filling structures comprising an insulating layer formed on an inner surface of the trench and a conductive material filled in the trench;
forming a doped region of a second conductivity type in a surface layer of the epitaxial layer of the first conductivity type located between the filling structures, and
forming an annular guard ring surrounding a cell region composed of the plurality of filling structures and the doped region of the second conductivity type, wherein the doped region of the second conductivity type and the filling structure form a conductive channel therebetween, the conductive channel formed to extend from a surface of the epitaxial layer;
forming an annular guard layer on the surface of the epitaxial layer of the first conductivity type other than the cell region, wherein the guard layer covers the guard ring; and
forming an upper electrode on the surface of the epitaxial layer of the first conductivity type, wherein the upper electrode is in contact with the conductive materials of the plurality of filling structures, the doped region of the second conductivity type, and the conductive channel.

7. A method of manufacturing a semiconductor rectifying device, comprising:
providing a substrate of a first conductivity type, and forming an epitaxial layer of the first conductivity type on a front side of the substrate of the first conductivity type;
defining a plurality of trenches on the epitaxial layer of the first conductivity type, and forming a plurality of filling structures in the plurality of trenches, each of the filling structures comprising an insulating layer formed on an inner surface of the trench and a conductive material filled in the trench;
forming a doped region of a second conductivity type in a surface layer of the epitaxial layer of the first conductivity type located between the filling structures; and
forming an annular guard ring surrounding a cell region composed of the plurality of filling structures and the doped region of the second conductivity type, wherein the doped region of the second conductivity type and the filling structure form a conductive channel therebetween;

forming an annular guard layer on a surface of the epitaxial layer of the first conductivity type other than the cell region, wherein the guard layer covers the guard ring; and
forming an upper electrode on the surface of the epitaxial layer of the first conductivity type, wherein the upper electrode is in contact with both the conductive materials of the plurality of filling structures, and the doped region of the second conductivity type,
wherein the step of defining the plurality of trenches on the epitaxial layer of the first conductivity type and forming the plurality of filling structures inside the plurality of trenches comprises:
forming an oxide layer on the epitaxial layer of the first conductivity type, and then forming a silicon nitride layer on the oxide layer,
patterning the silicon nitride layer and the oxide layer, and performing silicon etching to the epitaxial layer of the first conductivity type using the silicon nitride layer and the oxide layer as a mask to form the plurality of the trenches,
removing the silicon nitride layer and the oxide layer as the mask, and
forming an insulating layer on the epitaxial layer of the first conductivity type, and then forming a conduction material on the insulating layer to completely fill the trench to form the filling structure.

8. The method of claim 7, wherein the step of forming the doped region of the second conductivity type in the surface layer of the epitaxial layer of the first conductivity type located between the filling structures while forming the annular guard ring surrounding the cell region composed of the plurality of filling structures and the doped region of the second conductivity type comprises:
removing the conductive material and the insulating layer located outside the trench;
performing two implantations of a dopant of the second conductivity type to a region between the filling structures of the surface layer of the epitaxial layer of the first conductivity type, and an annular region surrounding the cell region, using a photoresist as a mask, wherein the dopant of the second conductivity type is implanted for a first time with an energy of 60 to 120 keV and a dosage of $1e^{11}$ to $1e^{14}$; the dopant of the second conductivity type is implanted for a second time with an energy of 20 to 40 keV and a dosage of $1e^{14}$ to $1e^{15}$; and the conductive channel is formed between the doped region of the second conductivity type and the filling structure; and
removing the photoresist and performing heat treatment to a region where the dopant of the second conductivity type is implanted.

9. The method of claim 7, wherein the step of forming the doped region of the second conductivity type in the surface layer of the epitaxial layer of the first conductivity type located between the filling structures while forming the annular guard ring surrounding the cell region composed of the plurality of filling structures and the doped region of the second conductivity type comprises:
performing two implantations of a dopant of the second conductivity type to a region between the filling structures of the surface layer of the epitaxial layer of the first conductivity type, and the annular region surrounding the cell region, using a photoresist as a mask, wherein the dopant of the second conductivity type is implanted for a first time with an energy of 60 to 120 keV and a dosage of $1e^{11}$ to $1e^{14}$; the dopant of the second conductivity type is implanted for a second time with an energy of 20 to 40 keV and a dosage of $1e^{14}$ to $1e^{15}$; and the conductive channel is formed between the doped region of the second conductivity type and the filling structure;

removing the conductive material and the insulating layer located outside the trench; and removing the photoresist and performing heat treatment to a region where the dopant of the second conductivity type is implanted.

10. The method of manufacturing the semiconductor rectifying device of claim 6, wherein the step of forming the annular guard layer on the surface of the epitaxial layer of the first conductivity type other than the cell region comprises:

forming a layer of tetraethyl orthosilicate having a thickness of from 300 nm to 1600 nm on the surface of the epitaxial layer of the first conductivity type by deposition, and then removing partial layer of the tetraethyl orthosilicate by etching to form a guard layer covering the guard ring.

11. The method of manufacturing the semiconductor rectifying device of claim 6, wherein the step of forming the upper electrode on the surface of the epitaxial layer of the first conductivity type comprises:

forming a first metal layer on the surface of the epitaxial layer of the first conductivity type by sputtering, and then forming the upper electrode in contact with both the conductive materials of the plurality of the filling structures and the doped region of the second conductivity type by etching the first metal layer.

12. The method of manufacturing the semiconductor rectifying device of claim 6, wherein after forming of the upper electrode on the surface of the epitaxial layer of the first conductivity type, the method further comprises the steps of:

back-grinding the substrate of the first conductivity type, and then forming a second metal layer as a lower electrode on a backside of the ground substrate of the first conductivity type by sputtering.

\* \* \* \* \*